(12) United States Patent
Chauveau et al.

(10) Patent No.: US 10,724,348 B2
(45) Date of Patent: Jul. 28, 2020

(54) METHOD OF EXPLOITING A SEDIMENTARY BASIN COMPRISING HYDROCARBONS, BY MODELLING THE ACCUMULATION OF TERRESTRIAL ORGANIC MATTER

(71) Applicant: IFP Energies nouvelles, Rueil-Malmaison (FR)

(72) Inventors: Benoit Chauveau, Carrieres sur Seine (FR); Arnaud Pujol, Rueil Malmaison (FR); Leo Agelas, Suresnes (FR); Didier Granjeon, Le Vesinet (FR)

(73) Assignee: IFP Energies nouvelles, Rueil-Malmaison (FR)

( * ) Notice: Subject to any disclaimer, the term of this patent is extended or adjusted under 35 U.S.C. 154(b) by 164 days.

(21) Appl. No.: 16/007,104

(22) Filed: Jun. 13, 2018

(65) Prior Publication Data
US 2018/0355702 A1 Dec. 13, 2018

(30) Foreign Application Priority Data
Jun. 13, 2017 (FR) .................................... 17 55284

(51) Int. Cl.
*E21B 41/00* (2006.01)
*E21B 49/00* (2006.01)
(Continued)

(52) U.S. Cl.
CPC .......... *E21B 41/0092* (2013.01); *E21B 49/00* (2013.01); *E21B 49/08* (2013.01);
(Continued)

(58) Field of Classification Search
CPC ...... E21B 41/0092; E21B 43/20; E21B 49/00; E21B 49/08; G01V 11/00; G01V 1/306;
(Continued)

(56) References Cited

U.S. PATENT DOCUMENTS 5,844,799 A 12/1998 Joseph et al.
7,043,367 B2 * 5/2006 Granjeon ............. G01V 99/005
 702/2
(Continued)

FOREIGN PATENT DOCUMENTS

EP 2743738 A1 6/2014
FR 2744224 A1 8/1997
FR 2830646 A1 4/2003

OTHER PUBLICATIONS

Remy Deschamps et al: "The coal-bearing strata of the Lower Cretaceous Mannville Group (Western Canadian Sedimentary Basin, South Central Alberta). Part 1: Stratigraphic architecture and coal distribution controlling factors", International Journal of Coal Geology, vol. 179, (Jun. 1, 2017), pp. 113-129, XP055447980, Amsterdam, NL.

*Primary Examiner* — Daniel P Stephenson
(74) *Attorney, Agent, or Firm* — Fitch, Even, Tabin & Flannery LLP

(57) ABSTRACT

Hydrocarbons are exploited within a sedimentary basin using a stratigraphic simulation coupled with a hydrologic model and a terrestrial organic matter accumulation model. The inorganic sediment distribution within the basin is determined with a stratigraphic simulator for at least one time step. Then, at least one unsaturated zone is delimited within the basin using a hydrologic model. At least one zone of terrestrial organic matter accumulation within the basin and an amount of terrestrial organic matter accumulated in this accumulation zone are determined by a model of the terrestrial organic matter accumulation as a function of the unsaturated zone thickness, of the unsaturated zone thickness stability and of the surface water flux defined for the time step considered.

16 Claims, 1 Drawing Sheet

(51) Int. Cl.
  *E21B 49/08* (2006.01)
  *G01V 99/00* (2009.01)
  *G01V 1/30* (2006.01)
  *G01V 11/00* (2006.01)
  *E21B 43/20* (2006.01)

(52) U.S. Cl.
  CPC .............. *G01V 1/306* (2013.01); *G01V 11/00* (2013.01); *G01V 99/005* (2013.01); *E21B 43/20* (2013.01); *G01V 2210/624* (2013.01); *G01V 2210/64* (2013.01); *G01V 2210/661* (2013.01)

(58) Field of Classification Search
  CPC ......... G01V 2210/624; G01V 2210/64; G01V 2210/661; G01V 99/005
  See application file for complete search history.

(56) References Cited

U.S. PATENT DOCUMENTS

| | | | |
|---|---|---|---|
| 9,971,061 B2* | 5/2018 | Granjeon | G01V 99/005 |
| 10,502,863 B2* | 12/2019 | Mosse | G01V 11/00 |
| 2002/0013687 A1* | 1/2002 | Ortoleva | E21B 41/0064 |
| | | | 703/10 |
| 2005/0015228 A1 | 1/2005 | Carpentier et al. | |
| 2006/0136162 A1* | 6/2006 | Hamman | G01V 1/306 |
| | | | 702/104 |
| 2007/0265782 A1 | 11/2007 | Kleinberg et al. | |
| 2010/0175886 A1* | 7/2010 | Bohacs | G06N 7/005 |
| | | | 166/369 |
| 2010/0228485 A1* | 9/2010 | Betancourt | G01V 11/00 |
| | | | 702/13 |
| 2011/0264430 A1* | 10/2011 | Tapscott | G01V 99/00 |
| | | | 703/10 |
| 2014/0163883 A1 | 6/2014 | Granjeon et al. | |
| 2015/0066461 A1 | 3/2015 | Kacewicz | |
| 2018/0347321 A1* | 12/2018 | Hamon | E21B 41/0092 |
| 2018/0355702 A1* | 12/2018 | Chauveau | G01V 1/306 |
| 2019/0129056 A1* | 5/2019 | Rasmus | G01V 3/28 |
| 2019/0219558 A1* | 7/2019 | Villar De Andrade E Silva | E21B 43/34 |

* cited by examiner

METHOD OF EXPLOITING A SEDIMENTARY BASIN COMPRISING HYDROCARBONS, BY MODELLING THE ACCUMULATION OF TERRESTRIAL ORGANIC MATTER

CROSS REFERENCE TO RELATED APPLICATIONS

Reference is made to French Application No. 1755284 filed Jun. 13, 2017, which are incorporated herein by reference in their entirety.

BACKGROUND OF THE INVENTION

Field of the Invention

The present invention relates to the field of petroleum reservoir or geological gas storage site exploration and exploitation.

Description of the Prior Art

Petroleum exploration is the search for hydrocarbon reservoirs within a sedimentary basin. Understanding the principles of hydrocarbon genesis and the connections thereof with the subsurface geological history has allowed development of methods for assessing the petroleum potential of a sedimentary basin. The general procedure for assessing the petroleum potential of a sedimentary basin proceeds from a prediction of the petroleum potential of the sedimentary basin, to measured data relative to the basin (outcrop analysis, seismic surveys, drilling data for example), and to exploratory drilling operations in the various zones having the best potential, in order to confirm or invalidate the previously predicted potential and to acquire new data for specifying the petroleum potential of the basin.

Petroleum reservoir exploitation proceeds, from data collected during the petroleum exploration phase, to selection of the reservoir zones with the best petroleum potential, to defining optimum exploitation schemes for these zones (using reservoir simulation for example in order to define the number and positions of the exploitation wells allowing optimum hydrocarbon recovery), to drilling exploitation wells and, in general terms, putting in place production infrastructures necessary for reservoir development.

Petroleum potential assessment of a sedimentary basin can be done either in a probabilistic manner or analytically. The analytical approach is most often implemented using computer software programs enabling synthesis of the available data and simulation of the geological history of the basin. Depending on the complexity of the geological history of the basin, the family of softwares used for the analytical approach can comprise one, two or three-dimensional simulation of the sedimentary, tectonic, thermal, hydrodynamic, organic and inorganic chemical processes involved in the formation of a petroleum basin. This is referred to as a "basin modelling" approach.

Concerning more particularly sedimentary process modelling, software referred to as stratigraphic modelling software is used. The objective of stratigraphic modelling is to simulate the evolution of a sedimentary basin over geologic time in order to quantify notably the geometry of the sedimentary layers, the type of sediments deposited, the water depth upon deposition, etc. There are known 3D stratigraphic models, solved numerically via computer softwares, such as the stratigraphic simulator DionisosFlow™ (IFP Energies nouvelles, France). In general terms, the various stratigraphic models consider three main processes:
- the creation (or the suppression) of space available for sedimentation through tectonic, eustatic and flexural movements;
- the sediments supplied to the basin, either through boundaries or through in-situ production or precipitation; and
- the transport of these sediments in the available space created, which can be permanent sediment transport, and at least one of episodic sediment transport and catastrophic sediment transport.

A new stratigraphy is then determined on the basis of the mass conservation principle.

BACKGROUND OF THE INVENTION

The following documents are mentioned in the description hereafter:
Bohacs, K and Suter, J. (1997). Sequence Stratigraphic Distribution of Coaly Rocks: Fundamental Controls and Paralic Examples. AAPG Bulletin, V. 81, No. 10 (October 1997), P. 1612-1639.
Granjeon D. et Joseph P. (1999) Concepts and Applications of a 3D Multiple Lithology, Diffusive Model in Stratigraphic Modeling. In: Harbaugh J. W., Watney W. L., Rankey E. C., Slingerland R., Goldstein R. H., Franseen E. K. (Eds.). Numerical Experiments in Stratigraphy: Recent Advances in Stratigraphic and Sedimentologic Computer Simulations. SEPM Special Publications, 62, p. 197-210.
Mann, U. and Zweigel, J., (2008). Modelling Source Rock Distribution and Quality Variations: The OF-Mod approach. In: Analogue and Numerical Forward Modelling of Sedimentary Systems; from Understanding to Prediction (P. L. de Boer, G. Postma, C. J. van der Zwan, P. M. Burgess and P. Kukla, eds.). Special Publication 40 of the International Association of Sedimentologists, pp. 239-274.

Assessing the petroleum potential of a sedimentary basin requires to best characterize the distribution of sediments in a sedimentary basin and, more particularly, the distribution and the quality of the organic matter within these sediments, controlled by the deposition, and at least one of degradation and preservation processes relative to this organic matter. Good characterization of organic matter-rich sedimentary layers thus notably requires good understanding the basin stratigraphy, that is the geometry of the sedimentary layers, the distribution of the fine and coarse sediments within these layers and the impact of the filling dynamics on the final distribution and the quality of the organic matter.

Mostly, current stratigraphic models allow tracing the history of inorganic sediment deposits within a basin. However, the petroleum industry additionally wants to know whether, over geologic time, the basin has experienced favorable conditions for organic matter deposition and preservation, as well as the location and quality of such deposits, if relevant.

Thus, it appears important to predict the distribution and the quality of the organic matter within a sedimentary basin. Three types of organic matter can generally be distinguished:
- organic matter of marine origin, resulting from the in-situ production of organic matter, initially produced in the photic zone, then preserved over geologic time;

lacustrine organic matter, resulting from the in-situ production of organic matter, initially produced in the photic or benthic zone, then preserved over geologic time; and terrestrial organic matter, resulting from the in-situ production of organic matter, at the land surface of a sedimentary basin, then preserved over geologic time.

The Of-Mod™ model (SINTEF, Norway) predicts the distribution and the quality of organic matter deposited in a marine environment in stratigraphic sequences. This model is notably described in the document (Mann and Zweigel, 2008). This model requires a 3D numerical model of the sedimentary basin, provided by a stratigraphic model or a geomodeller, and it quantifies the organic carbon content of sediments by simulating the organic matter production and degradation. However, although this model can be adapted to the prediction of distribution and quality of marine organic matter, management of the terrestrial organic matter in this model is relatively far from the physical reality. Indeed, the approach described in this application is based on a hypothesis for correlation between the inorganic sediment supplies and the terrestrial organic matter. Furthermore, this model does not determine terrestrial organic matter production/preservation zones as a function notably of a hydrologic balance and/or of the fluid circulations within the basin.

EP patent application 2,743,738 which corresponds to US published application 2014/0,163,883 concerns the determination of the organic matter distribution and quality in a sedimentary basin from a coupling between a stratigraphic model and an organic matter production, degradation and transport model. However, the production, degradation and transport model described in this application is relatively simplistic in the case of a terrestrial organic matter deposit because it does not realistic alloy model at least one of the hydrologic state of the basin and of the fluid circulations within the basin. Indeed, in the case of this approach, the groundwater level is assumed to be proportional to a water flux at the basin surface. This hypothesis is, in many cases, far from reality. Thus, for example, this hypothesis disregards: (1) the very high impact that the presence of a lake may have on the groundwater table and, therefore, on the vadose zone; (2) the existence of river systems disconnected from the water tables. Thus, such a hypothesis might lead to incorrectly reproduce the palustrine environments (terrestrial organic matter production zones around lakes) or to overestimate the production of terrestrial organic matter in topographic highs (where rivers and water tables may often appear to be disconnected).

SUMMARY OF THE INVENTION

The invention is a method for assessing, in the most deterministic manner possible, the distribution of organic matter of terrestrial origin in a sedimentary basin. The present invention therefore rests on a coupling between a stratigraphic model, a hydrologic model and a terrestrial organic matter in-situ accumulation model closer to physical reality. In particular, the terrestrial organic matter in-situ accumulation model accounts for the hydric conditions within the sedimentary basin, which are determined from a hydrologic model more representative of physical reality. Moreover, coupling between the terrestrial organic matter accumulation model and the stratigraphic model allows the organic matter deposited at a given time step to be transported, via stratigraphic modelling, to a next time step.

According to a variant embodiment, the present invention allows modelling, in addition to the accumulation of terrestrial organic matter preserved at the location of its production zone, the accumulation of the in-situ non-preserved part of the terrestrial organic matter produced.

The present invention thus is a method of exploiting hydrocarbons within a sedimentary basin, the basin resulting notably from the deposition of inorganic sediments and of terrestrial organic matter. The method is implemented from property measurements relative to the depositions and to the hydrology of the basin, by use of a stratigraphic simulator performing computer stratigraphic modelling for a succession of time steps. According to the invention, for at least one time step:

A. Constructing for the time steps by use of the simulator and parameters of the simulator from the measurements, a gridded representation representative of at least the distribution of the inorganic sediments within the basin for the time steps is, B. by use of a hydrologic model, parameters of the hydrologic model constructed from the measurements, and the gridded representation, constructing at least one unsaturated zone delimited within the basin, C. by use of an accumulation model of the organic matter and of parameters of the accumulation model, comprising the thickness of the unsaturated zone at the time step, the stability of the thickness of the unsaturated zone during the time steps and the surface water flux at the time steps, determining at least one accumulation zone of the terrestrial organic matter within the basin and an amount of terrestrial organic matter accumulated in the accumulation zone.

Then, from at least the amount of accumulated terrestrial organic matter and the gridded representation, quantifying the petroleum potential of the basin defining, an exploitation scheme for the basin and exploiting the basin according to the scheme.

According to an embodiment of the invention, each cell of the gridded representation determined by use of the stratigraphic simulator can comprise at least one property relative to the lithologic facies of the inorganic sediments of the cell.

According to an implementation of the invention, the parameters of the hydrologic model can comprise the hydraulic conductivity in each cell of the gridded representation, and the hydraulic conductivity in one of the cells can be determined at least from the property relative to the lithologic facies of the organic sediments in the cell.

According to a variant embodiment of the invention, the hydrologic model can delimit a saturated zone of the basin by accounting for pressure gradients in the basin and defining the base of the unsaturated zone by the top of the saturated zone.

According to an implementation of the invention, a cell of the gridded representation can be contained in a zone of potential accumulation of the terrestrial organic matter if:

the thickness of the unsaturated zone at the time step is at most 1 m, and the surface water flux is at most 10 m³/s.

According to an implementation of the invention, a cell of the gridded representation located in the potential accumulation zone can belong to the accumulation zone of the terrestrial organic matter if the thickness of the unsaturated zone in the potential accumulation zone does not vary during the time step.

According to a variant embodiment of the invention, the unsaturated zone can be considered to be stable if an equality of the form as follows is verified:

$$Su=SR+SL$$

where SL is a eustatic variation rate, SR is a sedimentation rate relative to the deposition of the organic sediments and the inorganic sediments, and SU is a subsidence rate.

According to an implementation of the invention, the amount of accumulated terrestrial organic matter can be determined from an accumulation rate TAM of the terrestrial organic matter determined with a formula:

$$TAM=Su-SRin-SL$$

where SL is a eustatic variation rate, SRin is a sedimentation rate relative to the deposition of said inorganic sediments, and SU is a subsidence rate.

Furthermore, the invention relates to a computer program product downloadable from at least one of a communication network and recorded on a computer-readable medium and is executable on a processor, comprising program code instructions for implementing the method as described above, when the program is executed on a computer.

BRIEF DESCRIPTION OF THE DRAWINGS

Other features and advantages of the method according to the invention will be clear from reading the description hereafter of embodiments given by way of non limitative example, with reference to the accompanying figures wherein.

DETAILED DESCRIPTION OF THE INVENTION

Figure 1:
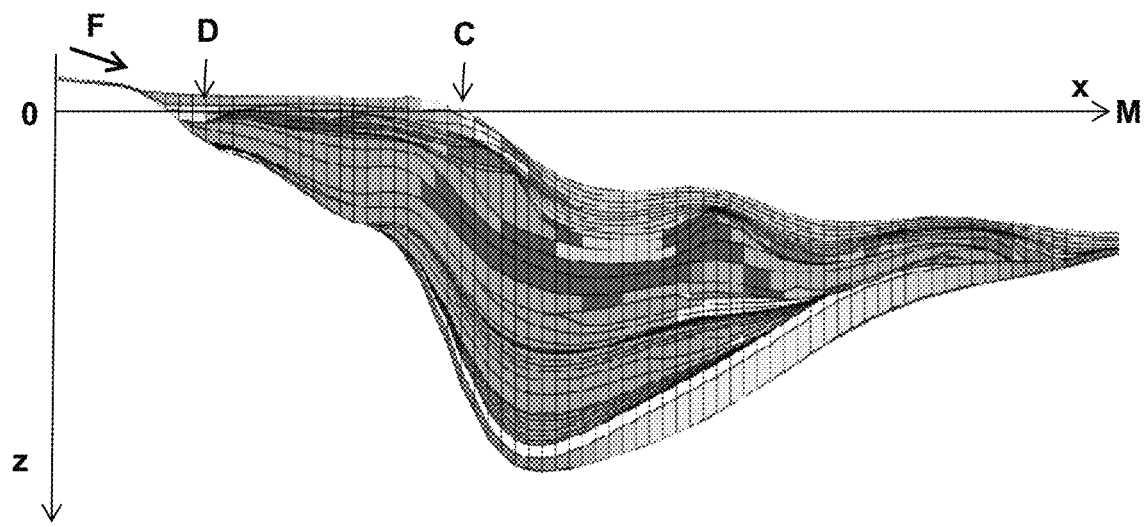
FIG. 1 shows an example of a gridded representation obtained by implementing a stratigraphic simulation for a given sedimentary basin and for a given time step.

In general terms, the invention is a method for exploiting hydrocarbons present in a sedimentary basin. A sedimentary basin is generally made up of sediments successively deposited over time. The sediments can be inorganic (such as clastic deposits, carbonate deposits, etc.) or organic (organic matter deposits of lacustrine, marine and/or terrestrial origin). The present invention applies in cases where the sedimentary basin results from the deposition of inorganic sediments and organic sediments at least of terrestrial origin. In particular, the present invention reliably quantifies the distribution of the organic matter of terrestrial origin deposited within a sedimentary basin. Terrestrial organic matter is understood to be organic matter that is at least neither of marine nor of lacustrine origin. The present invention is particularly but not exclusively suited in the case of terrestrial organic matter deposits in peat bog type environments.

The method according to the invention is based on at least three coupled models: which are a stratigraphic model which models the stratigraphic evolution of a sedimentary basin, a hydrologic model delimiting notably the unsaturated zone of the basin studied and a terrestrial organic matter accumulation model. According to an implementation of the invention, the numerical simulations based on each one of these models are executed on a computer sequentially or, alternatively, the stratigraphic, hydrologic and accumulation models according to the invention are solved simultaneously.

The present invention requires:
measurements relative to the inorganic sediment deposits in the basin which are in-situ measurements allowing notably determination of the current architecture of the basin, for qualifying the various inorganic sedimentary deposits (mineralogical composition or at least deposit type composition, thicknesses, ages, deposition conditions, etc.) or the geological events undergone by the basin over geologic time (erosion, subsidence, eustatism, etc.). These measurements can be at least one of outcrop surveys and similar surveys, well logs made along boreholes drilled through the basin, rock samples taken for example by core drilling, and seismic images obtained from seismic acquisition surveys. From these measurements, the input parameters of a stratigraphic simulation, such as the basin morphology (notably topography, and also layer boundaries), the inorganic sediment supplies, their transport for each time step can be defined. For example, the morphology for a given time step can be obtained from the current measured morphology (in a seismic image for example) and by use of a structural restoration which is a known, which can for example be performed using the Kronos-Flow software (IFP Energies nouvelles, France). Similarly, the sediment supplies for a given time step can be determined from the volume of the currently observed sedimentary layer, divided by the sedimentation time and, if relevant, by accounting for a terrestrial organic matter production rate. Finally, the transport parameters for a given time step can be assessed from deposit profiles established from the observation of the basin at the current time. These measurements can also allow defining input parameters for the hydrologic model and the terrestrial organic matter accumulation model according to the invention;

measurements relative to the deposition of organic matter of terrestrial origin which are in-situ measurements, performed in currently existing peat bogs, in the basin or in a similar basin, from which a terrestrial organic matter production rate can notably be deduced. For example, a rate of production from currently observable peat bogs can be measured in situ, then this production rate is determined over a short time scale (1 to 10 mm/year) is transcribed into a production rate on a longer time scale (of the order of a million years) using an upscaling method. Conventionally, the terrestrial organic matter production rates observed on the geologic scales range between 1 and 200 m/Ma. Document (Bohacs and Suter, 1997) for example reports a range of organic matter production rates as a function of climates. These measurements can allow defining input parameters for the stratigraphic model and the terrestrial organic matter accumulation model according to the invention;

measurements relative to the hydrology of the basin which are in-situ measurements notably allowing qualifying hydrologic parameters of the basin, at the current time and preferably for prior geologic times. For the present time, these measurements can be rainfall, evaporation and aquifer flux measurements of the basin. For prior geologic times, the current measurements can for example be extrapolated from the knowledge of prior climates deduced from the observation of the basin at the current time, or one may assume that the transport parameters are equivalent to those of the current rivers, and that the rainfall and evaporation are defined with reference to the current climate zones. These measurements notably allow defining the transport parameters required at the input of a stratigraphic simulation, as well as parameters of the hydrologic model and of the terrestrial organic matter accumulation model according to the invention;

a stratigraphic simulator which is software for reconstructing the sedimentary processes that have affected the basin from a geologic time t to the current time. A numerical stratigraphic simulation is generally implemented in a discrete manner over time, that is a stratigraphic simulation simulates the stratigraphic state of the basin for a succession of time steps. A time step of a stratigraphic simulator corresponds to a geologic time period during which sedimentary deposits or erosions have been recorded. Simulation of the filling history of a sedimentary basin is achieved from the input parameters representative of the sedimentary history of the basin. According to an implementation of the invention, the input parameters of a stratigraphic simulation are at least (1) the space available for sedimentation, linked with tectonic and/or eustatic movements, and with the mechanical compaction of the sediments (or squeezing together of sediments under the effect of the weight of overlaying layers), (2) the sediments supplied to the basin, either through the boundaries or through in-situ production or precipitation, (3) the transport of these sediments (transport capacity assessed from the characteristics of the sediments, such as the size of the grains or the density thereof, from the water flux flowing at the ground surface and the local slope of the basin) in the available space created. The system of equations describing these processes can for example be solved by a finite-volume spatial discretization and an explicit finite-volume scheme. Conventionally, after a stratigraphic simulation, at least the evolution of the basin topography over time, the distribution of the sediments in space and time, the distribution of the depositional environments (marine, lacustrine or terrestrial), the location in time and space of the shoreline, and optionally the surface water flux (such as the surface runoff) are available. According to an implementation of the invention, the distribution of the sediments within the basin for a given time step can be shown as a gridded representation where each cell is at least filled with facies (for example a sandstone can be distinguished from a limestone, but a limestone can also be distinguished from another limestone by its percentage of marl). Similarly, the distribution of the depositional environments for a given time step can come as a categorical property representative of the environment type (marine, lacustrine, terrestrial); the neighboring cells having the same categorical property value then belong to the same depositional environment. The stratigraphic model according to the invention does not comprise modelling the production of organic matter of terrestrial origin. A description of such a stratigraphic simulator can for example be found in Granjeon and Joseph, 1999. An example of such a stratigraphic simulator is the Dionisos-Flow™ software (IFP Energies nouvelles, France).

According to an implementation of the invention, the method of the invention comprises at least stages 1) to 4) as follows. The sequence of stages 1) to 3) are applied for at least one time step of the stratigraphic simulation. Alternatively, stages 1) to 3) are carried out simultaneously, so that the models on which these stages based are solved simultaneously. This alternative provides at least one of higher efficiency in terms of computing time and prevents the solution of one of the models from being a function of the solution of a model solved in the previous stage.

1. Stratigraphic modelling
2. Hydrologic modelling of the unsaturated zone
3. Terrestrial organic matter accumulation modelling
4. Exploiting the hydrocarbons of the formation Preferably, stages 1) to 3) are repeated for each time step of the stratigraphic simulation. Advantageously, stages 1) to 3) are at least repeated for each time step of the stratigraphic simulation for which modelling of the terrestrial organic matter deposits is desired.

1. Stratigraphic Modelling

The purpose of this stage is to model the at least inorganic sedimentary deposits within the basin for the time step considered. This stage is carried out using a stratigraphic simulator as described above, from stratigraphic simulation parameters as described above. These parameters are determined at least from measurements relative to the deposition of inorganic sediments and to the hydrology of the basin as described above. The stratigraphic simulator according to the invention can however enable modelling of organic sedimentary deposits of lacustrine and/or marine origin.

According to an embodiment of the invention, this stage is implemented using a stratigraphic simulator such as the one described in document Granjeon and Joseph, 1999. An example of such a stratigraphic simulator is the Dionisos-Flow™ software (IFP Energies nouvelles, France).

According to the invention, a gridded representation representative at least the distribution of the inorganic sediments within the basin for the time step being considered which is obtained at the end of this stage. According to an implementation of the invention, each cell of this representation is informed at least in terms of lithologic facies (sandstone, carbonates, etc.).

By way of illustration, FIG. 1 shows a vertical section in a gridded representation resulting from a stratigraphic simulation for a given time step. It can be observed in this figure that the architecture of the basin for the time step considered has the shape of a bowl in which successive sediments have settled, and part of these sediments has been delivered to the basin by a surface water flux F and at least part of the basin being below the sea level M. The limit of coast C delimiting the marine domain from the terrestrial domain can also be distinguished in this figure. Stratigraphic simulation for the time step being considered has allowed simulation of sedimentary deposit D (layer of cells closest to the surface of the basin). In the illustrated example, it is an inorganic matter deposit, deposited in the terrestrial domain (or continental zone).

2. Hydrologic Modelling of the Unsaturated Zone

This stage delimits the unsaturated zone within the basin for the time step being considered, by use of a hydrologic model and of input parameters of the hydrologic model.

In general terms, a sedimentary basin that has experienced a terrestrial organic matter deposition has, at least at a given geologic time, included a continental zone (or terrestrial domain). The continental zone of a given basin can notably be determined from the depositional environments as determined for example by stratigraphic simulation. In general, a continental zone of a sedimentary basin is subjected to a meteoric fluid flux (that is of non-marine origin) and it comprises:

an unsaturated zone or vadose zone which is the surface part of the continental zone of the sedimentary basin, with water unsaturated, including fresh water, subjected to hydrologic fluxes related to the precipitation percolation through the porous medium, and a saturated or phreatic zone located beneath the vadose zone which is a zone saturated with fresh water, subjected to hydrologic fluxes related to the flux of the underground phreatic layers.

In other words, the top of the phreatic zone corresponds to the base of the vadose zone and vice versa, and the top of the vadose zone corresponds to the topography of the basin at the time step being considered. According to an implementation of the invention, the top of the phreatic zone is determined by use of the hydrologic model, from which the base of the vadose zone is deduced.

In general terms, the input parameters of the hydrologic model according to the invention are determined from at least part of the measurements relative to the sediment deposits and the basin hydrology as described above, and from at least part of the information present in the gridded representation obtained at the end of the previous stage.

According to an implementation of the invention, the hydrologic model according to the invention can require a property representative of the flow properties of the porous medium contained in each cell of the gridded representation, such as permeability or hydraulic conductivity, for the time step being considered. According to an implementation of the invention, from the facies-filled gridded representation as obtained at the end of the previous stage and from a correspondence table between facies type and hydraulic conductivity value, each cell of the gridded representation is filled with hydraulic conductivity. Such correspondence tables are well known. Preferably, correspondence tables established on the basis of rock samples taken in the basin can be used. According to another implementation of the invention, the hydraulic conductivity can be determined from a facies type, a mineralogical composition and a porosity (the last two properties can be obtained for example using stratigraphic simulation or from correspondence tables), and by use of a homogenization method as described in EP patent application 3,104,199.

According to an implementation of the invention, in addition to the hydraulic conductivities, the hydrologic model according to the invention can further require properties such as:
 a precipitation rate which is a percentage representative of the precipitations that have occurred at the time step being considered. This precipitation rate is predetermined by knowledge of the basin at the time step being considered (for example from the mean climate at the time step being considered), and notably from measures relative to at least one of the hydrology and sedimentary deposits in the sedimentary basin being studied as described above,
 an infiltration coefficient weighting the supply of water from the surface (related to precipitation) to the groundwater system. Only part of the water flux related to the surface precipitations percolates to the groundwater table. This infiltration coefficient ranges for example between 1 and 100%, and it is predetermined according to knowledge of the basin at the time step being considered, notably from at least one measurements relative to the hydrology and sedimentary deposits in the basin as described above,
 a surface water flux which is the water flux moving along the topography of the sedimentary basin, related for example to the runoff or to the streams present at the surface of the basin at the time step considered. The surface water flux ranges for example between 10 and 1000 m³/s. It can be predetermined by knowledge of the basin at the time step being considered. For example, from a seismic image, the presence of channels in a geologic layer can be detected, and notably from the geometry of these channels an order of magnitude for the water flux at the time when this layer was at the surface of the basin can be defined. The surface water flux at the time step being considered can also be obtained from the stratigraphic simulation performed for the time step being considered in the previous stage. The stratigraphic simulator Dionisos-FlowlM (IFP Energies nouvelles, France) notably can assess the surface water flux at each time step,
 the location of the sedimentary basin coast is the limit between the marine domain and the terrestrial domain, which is determined for example from the depositional environments determined after the stratigraphic simulation, and more generally from the basin topography, the eustatism and the subsidence at the time step being studied;
 the topography of the sedimentary basin: is the topography at the input of the stratigraphic simulation for the time step being considered. The topography of the sedimentary basin evolves over the time step, due to the deposition of sediments for the current time step and to the subsidence undergone by the sedimentary basin during this time step.

Preferably, at least the top of the saturated zone (and thus the base of the unsaturated zone) can be delimited by a hydrologic equation wherein the flows in the free groundwater tables are conditioned by pressure gradients in the subsoil. More precisely, a hydrologic model resting on an equation of the type as follows can be defined:

$$S_s \frac{\partial h}{\partial t} - \nabla \cdot (K \nabla h) = Q$$

with:
h being the hydraulic head (L
t being time (T),
K being the hydraulic conductivity (or permeability) symmetric tensor (L.T$^{-1}$),
$S_s$ being the specific storage coefficient (L$_{-1}$),
Q being a source extraction term (pumping) [T$^{-1}$].

The source extraction term Q corresponds to the water recharge (or pumping) of the groundwater table through the precipitations minus evapotranspiration, and to the water supplies at the boundaries of the simulated zone (supply from the upstream zones and export to the downstream zones). According to this implementation of the invention, the substratum of the sedimentary basin is assumed to be impermeable. The solution of this equation allows determination of the hydraulic properties (hydraulic head and flow velocity) at any point of the basin. The elevation of the top of the groundwater table, which separates the phreatic zone from the vadose zone, and the pressure gradients are deduced from the calculated loads. Such an implementation of the hydrologic model notably allows determination of the level of the groundwater tables in the steady state. The location of the base of the vadose zone, corresponding to the top of the phreatic zone, can then be deduced therefrom.

Figure 2:
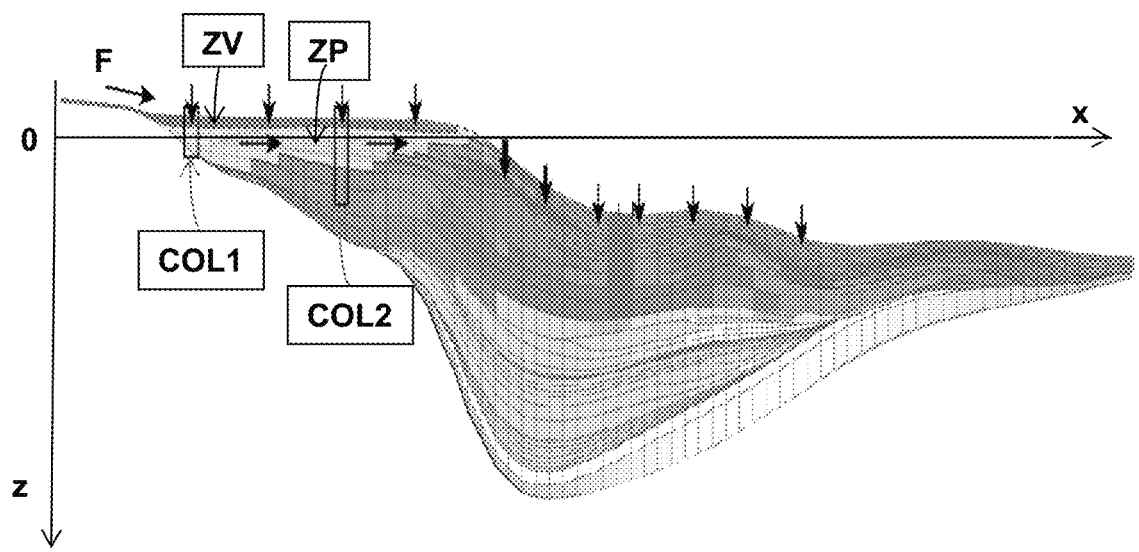
FIG. 2 shows a saturated zone and an unsaturated zone identified by use of the hydrologic model according to the invention for the sedimentary basin and the time step considered in FIG. 1.

By way of illustration, FIG. 2 shows an example of implementation of a hydrologic model for the same basin and for the same time step as those considered in FIG. 1. Thus, the basin, for this time step, comprises a meteoric vadose zone ZV and a meteoric phreatic zone ZP. The top of the phreatic zone corresponds to the base of the vadose zone. This FIG. 2 also shows, by way of illustration, in the form of arrows, the hydrologic fluxes undergone by the basin with a flux in vertical direction in vadose zone ZV, linked with the precipitation percolation, a flux in lateral direction in phreatic zone ZP, linked with the displacement of the underground water flux under the effect of the pressure gradients in the basin, and the surface water flux F linked with the presence of a river at the surface of the basin. This figure also shows the location of two cell columns COL1 and COL2 passing through both vadose zone ZV and phreatic zone ZP. The thickness of the vadose zone is different between these two columns.

3. Location and Quantification of the Terrestrial Organic Matter Accumulation

This stage locates and quantifies the accumulation of the terrestrial organic matter during the time step being considered. According to an embodiment of the invention, this stage can be carried out in three substages:

from the unsaturated zone delimitation as determined in the previous stage, determining potential accumulation zones for the terrestrial organic matter;

among the potential terrestrial organic matter accumulation zones, determining the effective terrestrial organic matter accumulation zones; and determining a rate of accumulation of the terrestrial organic matter in the effective accumulation zones and deducing therefrom the amount of accumulated organic matter.

3.1. Determining the Potential Zones of Accumulation of the Terrestrial Organic Matter Potential zones of accumulation of terrestrial organic matter are determined in this substage by considering two criteria based on:

the thickness of the unsaturated zone. When the vadose zone has a low thickness (less than or equal to 1 m for example), it may be considered to be a "wet" zone where the production of terrestrial organic matter is possible and even preserved by the presence of water that reduces the organic matter oxidation. On the other hand, when the vadose zone is thick (above 1 m for example), it is considered to be a "dry" area unfavorable for the production of organic matter of terrestrial origin. According to the invention, the thickness of the unsaturated zone is directly determined from the unsaturated zone delimitation determined using the hydrologic model according to the invention, and as described in the previous stage, and the surface water flux (linked with the runoff, the surface streams, etc.): If the water flux is too high (above 10 $m^3/s$ for example), no terrestrial organic matter deposition occurs. The environment is considered to be too hydrologically perturbed to enable sufficient biological life for production of an appreciable amount of terrestrial organic matter. The surface water flux can be a parameter obtained from the stratigraphic simulation or it can be a predetermined parameter.

According to the invention, when these two criteria are satisfied for a cell of the gridded representation, this cell corresponds to a potential accumulation zone for the terrestrial organic matter.

3.2. Determining the Effective Zones of Accumulation of the Terrestrial Organic Matter In this substage, it is determined if the potential zones of terrestrial organic matter accumulation are effective terrestrial organic matter accumulation zones, considering a criterion based on the stability of the unsaturated zone thickness during the time step being considered. Indeed, according to the invention, it is considered if, for a potential accumulation zone, the thickness of the unsaturated zone:

decreases during the time step, then the environment of the sedimentary basin studied is conducive to regular flooding, which consequently prevents any production of terrestrial organic matter;

increases during the time step, then the environment of the sedimentary basin studied dries out, which inhibits the production of organic matter and above all greatly increases the rate of degradation of this organic matter;

remains stable during the time step, then the hydric conditions within the sedimentary basin allow organic matter production and preservation during the time step considered.

According to the invention, a stability rate is determined for the vadose zone during the time step, from the variation of the topography and of the sedimentation rate in the basin during this time step. According to a variant embodiment of the invention, a stability rate of the vadose zone is evaluated during a time step as a function of a eustatic variation rate (SL), a sedimentation rate relative to the organic and inorganic sediment deposits (SR) and a subsidence rate (Su). For example, according to an implementation of the invention, the vadose zone is considered to be stable if the following equality is verified:

$$Su=SR+SL$$

In other words, according to this implementation of the invention, it is considered that, if the topographic change associated with the subsidence is compensated for by the deposition of (organic and inorganic) sediments and by the eustatic variations, then the vadose zone is stable. In cases where this equality is not verified, this means that either the thickness of the vadose zone increases, thus creating a flood zone unfavourable to the production of organic matter, or the thickness of the vadose zone decreases, creating a dryout zone also unfavourable to the production of organic matter. The inorganic matter sedimentation rate belongs to the input parameters of the stratigraphic simulation and it can be defined from the measurements relative to the stratigraphy as defined above. The organic sedimentation rate can be obtained from measurements relative to the organic sediments as described above, or from documents referencing such rates, such as document (Bohacs and Suter, 1997) for example.

3.3. Quantifying the Deposited Terrestrial Organic Matter

This substage determines the amount of organic matter accumulated in the effective accumulation zones as determined in substage 3.2 described above.

According to the invention, this amount is determined as a function of the estimation of an available space in each cell of the effective accumulation zones.

According to an implementation of the invention, a rate of accumulation of terrestrial organic matter during the time step is first determined from the variation of the topography, the terrestrial organic sedimentation rate and the inorganic sedimentation rate in the basin during this time step. In particular, according to a variant embodiment of the invention, the organic matter accumulation rate (TAM) during a time step is evaluated as a function of the eustatic variations (SL), the sedimentation associated with the deposition of inorganic (Srin) and organic (X) sediments, and the subsidence (Su). The organic matter sedimentation rate X is for example estimated with reference to document (Bohacs and Suter, 1997), which defines organic sedimentation rates ranging between 1 and 180 m/Ma depending on climates. For example, according to an implementation of the invention, if Su−SRin−SL≤X , then the organic matter accumulation rate TAM is equal to TAM=Su−SRin−SL. Then, secondly, once a rate of accumulation of terrestrial organic matter during the time step has been determined, the amount of terrestrial organic matter accumulated in each cell of the previously identified effective accumulation zones is determined by multiplying the terrestrial organic matter accumulation rate thus determined by the length of the time step.

According to an implementation of the invention where stages 1 to 3 are repeated for a succession of time steps of the stratigraphic simulation, the amount of terrestrial organic matter accumulated in a given cell at a given time step can be transported to other cells of the gridded representation by performing the stratigraphic modelling at the next time step.

According to a variant of the invention, when the terrestrial organic matter cannot be totally accumulated in the initial production zone because of insufficient available space, it can be exported to another deposition zone (a lacustrine or marine environment for example). According to this variant, following substages 3.1, 3.2 and 3.3, an amount of exported organic matter is determined by distinguishing between the amount of terrestrial organic matter produced (equal to the organic matter production rate used for implementing stage 3, multiplied by the length of the time step considered) and the amount of terrestrial organic matter accumulated in situ (equal to the rate of accumulation of terrestrial organic matter determined at the end of stage 3.3, multiplied by the length of the time step). The amount of exported organic matter thus determined can, at the next time step, be transported to another deposition zone of the sedimentary basin, via the sediment transport modelling of the stratigraphic simulation according to the invention.

4. Exploiting the Hydrocarbons of the Sedimentary Basin

The hydrocarbon potential of the sedimentary basin studied is estimated from the location and the quantification of the terrestrial organic matter deposited in the sedimentary basin for at least one time step and preferably for all the time steps of the simulation.

The hydrocarbons are formed from the organic matter present in the basin. Thus, the hydrocarbon potential can notably be estimated from the location of the organic matter in the basin, its abundance (referred to as organic matter richness) and origin (marine, terrestrial, lacustrine). The present invention notably allows quantifying more reliably the hydrocarbon potential relative to organic matter of terrestrial origin.

The TOC (total organic carbon), the hydrogen and oxygen indices, and the mineralogy of the organic matter within the sedimentary basin layers can for example be determined for this quantification.

For example, the final hydrogen index in the preserved organic matters is calculated as a function of the proportions of each type of organic matter present. According to an implementation of the invention, a hydrogen index specific to the terrestrial organic matter can further be determined, whose time- and space-varying value depends on the preservation conditions of this organic matter. Thus, the quality of the organic matter can for example be defined by a law of the type $HI=HI0 \cdot \alpha V^{\beta}$, where HI0 is the reference quality of the terrestrial organic matter, and $\alpha$ and $\beta$ are two calibration parameters allowing describing the impact of the vadose zone on the quality of the terrestrial organic matter produced under such conditions. Thus, this terrestrial organic matter quality is directly linked with the hydric conditions of the zone.

Such properties can for example be used as the input of a basin simulation. An example of such a basin simulation is the TemisFlow™ software (IFP Energies nouvelles, France), which notably allows quantifying the petroleum potential of a basin and determining the location of the petroleum reservoir within the basin.

An exploitation scheme is subsequently defined for the reservoir identified within this basin. For example, determination of an exploitation scheme comprises defining a number, a geometry and a site (position and spacing) for injection and production wells, and determining a type of enhanced recovery (waterflooding, surfactant flooding, etc.), etc. A hydrocarbon reservoir exploitation scheme must for example enable a high rate of recovery of the hydrocarbons trapped in the geological reservoir identified, over a long exploitation time, requiring at least one of a limited number of wells and infrastructures. Conventionally, determining a hydrocarbon exploitation scheme is done using a flow simulation. An example of such a flow simulation is the Puma Flow® software (IFP Energies nouvelles, France).

Then, once an exploitation scheme defined, the hydrocarbons trapped in the reservoir are exploited according to this exploitation scheme, notably by drilling the injection and production wells of the determined exploitation scheme, and by installing the production infrastructures necessary to the development of the reservoir.

The present invention is thus based on a coupling between a stratigraphic simulation, a hydrologic model and a terrestrial organic matter accumulation model allowing accounting for hydric conditions favorable to the deposition of this terrestrial organic matter and to the preservation thereof. More precisely, the present invention allows modelling of the evolution of hydric fluxes close to the surface of a sedimentary basin, notably the evolution of the unsaturated zone of this basin, which allows more realistic modelling of the location of terrestrial organic matter accumulation zones and of the amount of terrestrial organic matter thus accumulated. The present invention thus contributes to a better knowledge of the petroleum potential of the sedimentary basin, and allows defining conditions enabling optimum exploitation of this basin.

Computer Program Product

Furthermore, the invention concerns a computer program product which is at least one of being downloadable from a communication network and recorded on a computer-readable medium and executed by a processor, comprising program code instructions for implementing the method as described above, when the program is executed by a processor.

The invention claimed is:

1. A method of exploiting hydrocarbons within a sedimentary basin, including deposition of inorganic sediments and terrestrial organic matter, which is implemented from property measurements relative to the depositions and to hydrology of the basin, by using for at least one time step a stratigraphic simulator modelling a succession of time steps comprising:

A. using the simulator and parameters of the simulator for the at least one time step, with the parameters being constructed from the property measurements to determine a gridded representation representative of at least the distribution of the inorganic sediments within the basin for the at least one time step;

B. delimiting at least one unsaturated zone within the basin by using a hydrologic model and parameters of the hydrologic model, with the parameters of the hydrologic model being constructed from the property measurements and the gridded representation;

C. determining at least one accumulation zone of the terrestrial organic matter within the basin and an amount of terrestrial organic matter accumulated in the accumulation zone by using an accumulation model of the organic matter and of parameters of the accumulation model, the parameters of the accumulation model comprising a thickness of the unsaturated zone at the at least one time step, stability of the thickness of the unsaturated zone during the at least one time step and the surface water flux at the time step, and from at least an amount of accumulated terrestrial organic matter and the gridded representation quantifying a petroleum potential of the basin, defining an exploitation scheme for the basin and exploiting the basin according to the scheme.

2. A method as claimed in claim 1, wherein for each cell of the gridded representation at least one property relative to the lithologic facies of the inorganic sediments of the cell is determined by use of the stratigraphic simulator.

3. A method as claimed in claim 2, wherein the parameters of the hydrologic model comprise hydraulic conductivity in each cell of the gridded representation, the hydraulic conductivity in one of the cells being determined at least from a property relative to lithologic facies of the organic sediments in the cell.

4. A method as claimed in claim 3, wherein the hydrologic model delimits a saturated zone of the basin by accounting for pressure gradients in the basin and a base of the unsaturated zone is defined by a top of the saturated zone.

5. A method as claimed in claim 4, wherein a cell of the gridded representation is contained in a zone of potential accumulation of the terrestrial organic matter when a thickness of the unsaturated zone at the at least one time step is at most 1 m and surface water flux is at most 10 m3/s.

6. A method as claimed in claim 3, wherein a cell of the gridded representation is contained in a zone of potential accumulation of the terrestrial organic matter when a thickness of the unsaturated zone at the at least one time step is at most 1 m and surface water flux is at most 10 m3/s.

7. A method as claimed in claim 2, wherein the hydrologic model delimits a saturated zone of the basin by accounting for pressure gradients in the basin and a base of the unsaturated zone is defined by a top of the saturated zone.

8. A method as claimed in claim 7, wherein a cell of the gridded representation is contained in a zone of potential accumulation of the terrestrial organic matter when a thickness of the unsaturated zone at the at least one time step is at most 1 m and surface water flux is at most 10 m3/s.

9. A method as claimed in claim 2, wherein a cell of the gridded representation is contained in a zone of potential accumulation of the terrestrial organic matter when a thickness of the unsaturated zone at the at least one time step is at most 1 m and surface water flux is at most 10 m3/s.

10. A method as claimed in claim 1, wherein the hydrologic model delimits a saturated zone of the basin by accounting for pressure gradients in the basin and a base of the unsaturated zone is defined by a top of the saturated zone.

11. A method as claimed in claim 10, wherein a cell of the gridded representation is contained in a zone of potential accumulation of the terrestrial organic matter when a thickness of the unsaturated zone at the at least one time step is at most 1 m and surface water flux is at most 10 m3/s.

12. A method as claimed in claim 1, wherein a cell of the gridded representation is contained in a zone of potential accumulation of the terrestrial organic matter when a thickness of the unsaturated zone at the at least one time step is at most 1 m and surface water flux is at most 10 m3/s.

13. A method as claimed in claim 12, wherein a cell of the gridded representation located in a potential accumulation zone belongs to the accumulation zone of the terrestrial organic matter if a thickness of an unsaturated zone in the potential accumulation zone does not vary during the time step.

14. A method as claimed in claim 13, wherein the unsaturated zone is considered stable when an equality:

$$Su = SR + SL$$

is verified with SL being an eustatic variation rate, SR being a sedimentation rate relative to deposition of organic sediments and the inorganic sediments, and SU being a subsidence rate.

15. A method as claimed in claim 1, wherein an amount of accumulated terrestrial organic matter is determined from an accumulation rate TAM of terrestrial organic matter determined with a formula:

$$TAM = Su - SRin - SL$$

with SL being a eustatic variation rate, SRin being a sedimentation rate relative to the deposition of the inorganic sediments, and SU being a subsidence rate.

16. A computer program product storing program code instructions for implementing the method as claimed in claim 1, when the program is executed on a processor.

* * * * *